(12) United States Patent
Wu et al.

(10) Patent No.: US 6,391,706 B2
(45) Date of Patent: May 21, 2002

(54) METHOD FOR MAKING DEEP TRENCH CAPACITORS FOR DRAMS WITH REDUCED FACETING AT THE SUBSTRATE EDGE AND PROVIDING A MORE UNIFORM PAD SI$_3$N$_4$ LAYER ACROSS THE SUBSTRATE

(75) Inventors: Chao-Chueh Wu, Shin-Pu; Sheng-Fen Chiu, Taichung; Jesse Chung, Chu-Pei; Hsiao-Lei Wang, Tainan, all of (TW)

(73) Assignees: ProMos Technologies, Inc.; Mosel Vitelic, Inc., both of Hsin-Chu (TW); Infineon Technologies, Inc., Munich (DE)

( * ) Notice: Subject to any disclaimer, the term of this patent is extended or adjusted under 35 U.S.C. 154(b) by 0 days.

(21) Appl. No.: 09/816,356

(22) Filed: Mar. 26, 2001

(30) Foreign Application Priority Data

Jul. 27, 2000 (TW) .......................................... 089115006

(51) Int. Cl.$^7$ .......................................... H01L 21/8242
(52) U.S. Cl. ........................ 438/243; 438/244; 438/248; 438/249; 438/386; 438/391; 438/392
(58) Field of Search ................................. 438/243, 244, 438/246, 247, 248, 249, 386, 387, 389, 390, 391, 392

(56) References Cited

U.S. PATENT DOCUMENTS 6,184,107 B1 * 2/2001 Divakaruni et al. ........ 438/427

* cited by examiner

Primary Examiner—Chandra Chaudhari
Assistant Examiner—Jack Chen
(74) Attorney, Agent, or Firm—George O. Saile; Stephen B. Ackerman

(57) ABSTRACT

A method is achieved for making improved deep trench capacitors for DRAM circuits with reduced trench faceting at the wafer edge and improved pad silicon nitride (Si$_3$N$_4$) uniformity for increasing process yields. The method utilizes a thicker pad Si$_3$N$_4$ as part of a hard mask used to etch the deep trenches. Then, after forming the deep trench capacitors by a sequence of process steps a shallow trench isolation (STI) is formed. The method utilizes etching shallow trenches in the same thicker pad Si$_3$N$_4$ layer and into the silicon substrate. A second insulating layer is deposited and polished back (CMP) into the pad Si$_3$N$_4$ layer. A key feature is to use a second mask to protect the substrate center while partially etching back the thicker portion of pad Si$_3$N$_4$ layer at the substrate edge inherently resulting from the CMP. This minimizes the nonuniformity of the pad Si$_3$N$_4$ layer to provide a more reliable structure for further processing.

17 Claims, 10 Drawing Sheets

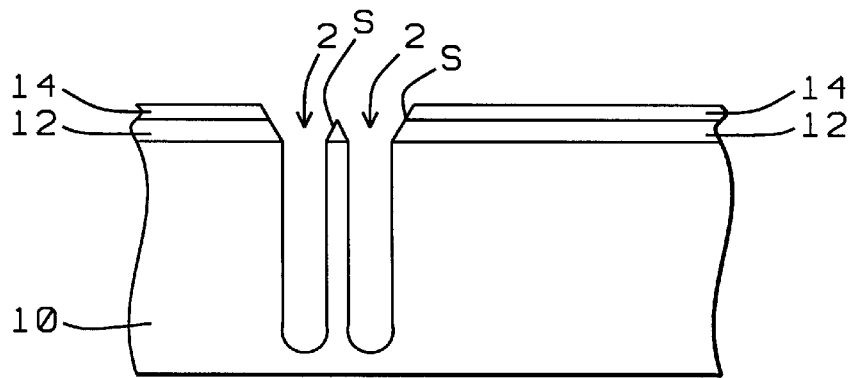
FIG. 1 – Prior Art
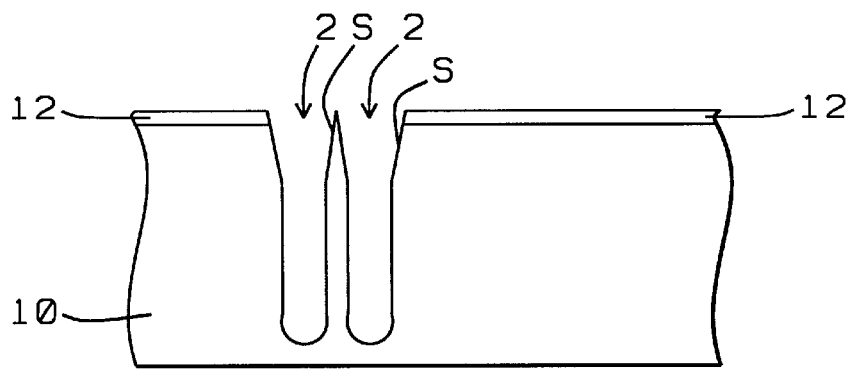
FIG. 2 – Prior Art

US 6,391,706 B2

METHOD FOR MAKING DEEP TRENCH CAPACITORS FOR DRAMS WITH REDUCED FACETING AT THE SUBSTRATE EDGE AND PROVIDING A MORE UNIFORM PAD SI$_3$N$_4$ LAYER ACROSS THE SUBSTRATE

BACKGROUND OF THE INVENTION (1) Field of the Invention

This invention relates to an integrated circuit semiconductor device, and more particularly to a method for making improved deep trench capacitors for dynamic random access memory (DRAM) devices. The method uses a thicker pad silicon nitride ($Si_3N_4$) layer with a chemical-vapor-deposited glass layer as a hard mask for etching the deep trenches. This avoids overetching and damaging (faceting) the hard mask at the extreme edge of the wafer when the deep trenches are etched in the wafer. At a later processing step after completing the trench capacitors, the pad silicon nitride layer is used as a polish-back stop layer for making shallow trench isolation (STI). Due to the inherent properties of the chemical-mechanical polishing (CMP), the polish-back stop layer has reduced thickness at the center of the wafer (substrate) and is thicker at the wafer edge. To further improve process yield after CMP, the invention uses an additional patterned mask layer to protect the wafer center while exposing the silicon nitride stop layer at the wafer edge. The thicker portion of the pad $Si_3N_4$ layer is partially removed at the water edge to form a more uniform pad $Si_3N_4$.

(2) Description of the Prior Art

Dynamic random access memory (DRAM) devices are used for storing digital information on arrays of memory cells in the form of charge stored on capacitors. Each memory cell consists of a single access transistor and a single storage capacitor. The storage capacitors are formed either by etching deep trenches in the substrate in each cell area, commonly referred to as trench capacitors, or are formed over the access transistors in the cell areas by depositing and patterning conducting layers over the access transistors, and are commonly referred to as stacked capacitors. The capacitors make electrical contact to one of the two source/drain areas (node contacts) of each FET (access transistor), while bit lines make electrical contact to the other source/drain area of each FET. Read/write circuits, on the periphery of the DRAM chip, are used to store binary data by charging or discharging the storage capacitor via the bit lines, and the binary data is read (or sensed) by peripheral sense amplifiers, also via the bit lines. However, each capacitor must lie within an area about the size of the cell area in order to accommodate all the capacitors in the large array of cells used on the DRAM device.

As the number of memory cells increases on the DRAM chip and the cell areas decreases, it becomes increasingly difficult to fabricate the storage capacitors with reasonable surface area for maintaining sufficient capacitance (charge). For example, after the year 2000 the number of memory cells on a DRAM chip is expected to exceed several gigabits. Further, as the cell area decreases, the available area for the storage capacitor in each cell also decreases. This makes it difficult to maintain sufficient capacitance for storing charge to provide the necessary signal-to-noise ratios.

One method used in the semiconductor industry to overcome the above problems is to form DRAM devices with stacked capacitors or trench capacitors. However, the stacked capacitors, which are built on the chip surface, result in rough topography which makes subsequent processing difficult and requires leveling and planarizing techniques that can be expensive.

An alternative method for making an array of DRAM cells is by forming deep trench capacitors in the silicon substrate. The surface therefore remains essentially planar and available for wiring for the DRAM circuit. Also, by forming the storage capacitors in a trench etched in the silicon substrate, it is possible to leave the substrate surface free for the bit lines, thereby providing adequate separation between bit line and storage capacitor. This also allows memory cells to be built with smaller surface areas for future high-density DRAM arrays.

However, as the diameter of the trench decreases to sub-quarter-micrometer widths, it becomes necessary to significantly increase the trench depth. For example, for future gigabit DRAMs the aspect ratio (depth/width) of the trench can be greater than 35. Unfortunately, etching these narrow deep trenches in a silicon substrate can be difficult to achieve and can result in excessive erosion of the hard mask and lead to damage of the substrate surface. This problem is particularly exacerbated at the edge of the substrate (wafer), and the problem becomes more severe as the substrate diameter increases. To better appreciate this problem, FIGS. 1 and 2 show schematic cross-sectional views replicating SEM cross-sectional views for two adjacent trenches of the multitude of trenches formed. FIG. 1 shows a cross section of two adjacent trenches 2 formed in the substrate 10 away from the edge of the substrate, and FIG. 2 shows a cross section of two adjacent trenches 2 formed at the edge of the substrate. Typically the trenches are made by forming a thin stress-release silicon oxide layer (not shown), and depositing a pad $Si_3N_4$ layer 12 and a chemical-vapor-deposited silicon oxide layer 14 to form a hard-mask layer. The hard-mask layer (layers 12 and 14) is then patterned using conventional photolithographic techniques and plasma etching to etch a multitude of openings for deep trenches. After stripping the photoresist, the hard mask is used to selectively etch deep trenches 2 in the substrate 10, two of which are shown in FIG. 1.

Although the $Si_3N_4$ layer 12 is faceted at the point S, the trenches 2 in the silicon substrate 10 have essentially vertical sidewalls, and the trench openings replicate the hard-mask openings. However, during typical processing to deposit the hard-mask layer, the $Si_3N_4$ is thinner at the edge of the substrate, and the plasma etching to form the trenches in the substrate generally etches faster at the substrate edge. This results in excessive faceting that damages the substrate at the edge and distorts the trench profile 2, as shown at points S in FIG. 2. In more severe cases of overetching, the etching of the array of closely spaced trenches can result in a series of silicon needle-like structures. In both cases, the overetch reduces the usable surface area on the substrate, thereby reducing product yield.

Another problem occurs later in the trench capacitor process in which the chemical-mechanical polishing (CMP) to form the shallow trench isolation results in non-uniform polish-back of the shallow trench film material and also results in non-uniform etching of the underlying pad $Si_3N_4$ layer 12. The graph in FIG. 14 show the thickness profile of the pad $Si_3N_4$ layer 12 as a function of distance from the center of the wafer to the edge. The y axis shows the $Si_3N_4$ thickness, and the x axis is the distance from the center of a 200-millimeter diameter wafer. As can be seen the thickness of the $Si_3N_4$ increases significantly due to the polishing loading effect as one approaches the edge of the wafer. The two curves in the graph (FIG. 14) represent the variation in the $Si_3N_4$ thickness in Angstroms. Curve A shows the results for a new polishing pad, and curve B shows the results for the conventional process using a polishing pad after several passes. The results of the polishing show unacceptable (increased) variations in thickness as one approaches the edge of the wafer. Therefore, it is strongly desirable to improve the uniformity as indicated by the curve C in FIG. 14.

Several methods of making deep-trench capacitors are described in the literature. For example, Golden et al. in U.S. Pat. No. 5,618,751 teach a method for making a deep trench using a photoresist fill and recess to simplify the process and improve repeatable capacitor uniformity from wafer to wafer. In U.S. Pat. No. 6,071,823 to Hung et al. a method is described for making a bottle-shaped etched deep trench for increased capacitance. Yoshida in U.S. Pat. No. 5,885,863 teaches a method for making a simple contact to buried doped regions, such as the buried plate of a DRAM deep trench capacitor. Ohtsuki in U.S. Pat. No. 5,629,226 teaches a method for making deep trench capacitors having increased capacitance by widening the bottom portion of the trench while simultaneously achieving high density integration. However, none of the references addresses overetching deep trenches at the edge of the wafer that causes excessive faceting of the deep trenches. Also, none of the references addresses the non-nonuniformity in the pad $Si_3N_4$ thickness across the wafer that results from CMP, as described above with respect to FIG. 14.

There is still a strong need in the semiconductor industry to further improve upon fabricating deep trench capacitors for DRAM cells with increased reliability that improves process yield, especially at the edge of substrate.

SUMMARY OF THE INVENTION

Accordingly, a principal object of this invention is to provide an array of DRAM chip areas, each chip area having an array of sub-micrometer-wide deep trench capacitors with reduced trench overetching at the extreme edge of the substrate (wafer) to reduce hard-mask faceting and to increase product yield.

Another object of this invention is to reduce faceting and damage at the substrate edge by using a thicker silicon nitride/borosilicate glass hard mask to reduce overetching of the hard mask when etching deep trenches.

A further object of this invention is to improve the uniformity of the pad $Si_3N_4$ layer by reducing the thickness of the pad layer at the edge of the wafer resulting from CMP. This is achieved using an additional novel blanket photoresist mask layer over the center of the wafer and exposing the pad $Si_3N_4$ (polish-stop) layer at the wafer edge. The exposed polish-stop layer is then partially etched to provide a more uniform pad $Si_3N_4$ (etch-stop layer) across the wafer.

In accordance with the objectives of the present invention, a method is described for making an array of trench capacitors in which overetching at the wafer edge is minimized by using a thick $Si_3N_4$ pad layer, and at a later step a novel photoresist mask is used with a plasma etch to optimize the pad $Si_3N_4$ thickness at the wafer edge and to improve the uniformity across the wafer.

The method for making an array of deep trench capacitors for DRAM devices up to and including shallow trench isolation is briefly described. The method consists of providing a semiconductor substrate, preferably a single-crystal silicon substrate. An etch-stop layer consisting of a pad $Si_3N_4$ layer and a first insulating layer is deposited to form a hard mask. The pad $Si_3N_4$ layer is deposited to a thickness sufficient to prevent overetching at the edge of the wafer, which can cause faceting and wafer damage when deep trenches for capacitors are etched. The first insulating layer is a borosilicate glass (BSG). Next a photoresist mask and plasma etching are used to etch an array of openings in the hard-mask layer to the substrate. The photoresist mask is removed and the hard-mask is now used as an etch mask to etch deep trenches in the substrate for capacitors. The trench capacitors are now formed by depositing an arsenic-doped glass (ASG) and etching back to leave portions of the ASG in the lower part of the trenches. The substrate is then annealed to diffuse arsenic into the substrate to form first capacitor electrodes. The remaining ASG is removed by stripping. A capacitor interelectrode dielectric layer is formed by depositing a thin $Si_3N_4$ layer and reoxidizing to form a silicon oxide/silicon nitride (ON) capacitor interelectrode dielectric layer on the sidewalls of the trenches. An N doped first polysilicon layer is deposited and recessed to fill the lower portion of the trenches. The exposed portions of the interelectrode dielectric layer on the upper sidewalls of the trenches is removed. A blanket collar $SiO_2$ layer is deposited on the substrate, annealed, and etched back to form a collar on the -upper portion of the sidewalls in the trenches. An N doped second polysilicon layer is deposited and recessed to leave portions in the upper part of the trenches to form the trench capacitors. An N doped third polysilicon layer is deposited and etched back to form interconnecting polysilicon straps to connect the trench capacitors to the substrate where semiconductor devices will be formed. Shallow trench openings are etched in the substrate over and between pairs of trench capacitors in the deep trenches. Shallow trench openings are also etched on the substrate for forming isolation regions for other circuits, such as DRAM peripheral circuits and merged logic/memory circuits. A short rapid thermal oxidation step is performed to form a thin $SiO_2$ on the exposed polysilicon surfaces. A relatively thin conformal insulating liner, preferably composed of $Si_3N_4$, is deposited. A second insulating layer is deposited sufficiently thick to fill the shallow trench openings. The second insulating layer is polished back to the pad $Si_3N_4$ layer to form the shallow trench isolation. A key feature of this invention is to use a second mask layer composed of organic photoresist, and the mask is patterned to leave blanket portions of the third insulating layer over the center of the wafer while exposing the underlying pad $Si_3N_4$ layer at the wafer edge. The pad $Si_3N_4$ layer at the wafer edge is then partially etched to improve the $Si_3N_4$ uniformity across the wafer, and the second mask is removed in a plasma asher. This completes the array of deep trench capacitors, up to and including the shallow trench isolation, with reduced faceting at the wafer edge and more uniform $Si_3N_4$ thickness, thereby improving process yields.

BRIEF DESCRIPTION OF THE DRAWINGS

The objects and advantages of this invention are best understood with reference to the attached drawings in the figures and the embodiment that follows.

FIG. 1 shows a prior-art schematic cross-sectional view replicating an SEM cross-sectional view for two adjacent trenches of an array of trenches having normal faceting for two trenches that are not at the edge of the wafer.

FIG. 2 shows a prior-art schematic cross-sectional view replicating an SEM cross-sectional view for two adjacent trenches of the array of trenches having excessive faceting and depicts the overetching of the trenches at the edge of the wafer.

DESCRIPTION OF THE PREFERRED EMBODIMENT

A method is described in detail for making deep trench capacitors for DRAMs with reduced overetching at the edge of the wafer by increasing the hard-mask thickness that includes a pad $Si_3N_4$ layer. Then at a later process step, an additional mask is formed to protect the center portion of the wafer while leaving exposed portions of the pad $Si_3N_4$ elsewhere on the substrate. The exposed $Si_3N_4$ is then partially etched back to provides a more uniform pad $Si_3N_4$ across the wafer. Although the method is especially applicable to making improved deep-trench capacitors across the wafer, and more specifically for making more reliable trenches at the edge of the wafer, it should be understood by those skilled in the art that the method is generally applicable to other applications where overetching occurs at the edge of the wafer, and also where more uniform polish-back is desired.

Figure 3:
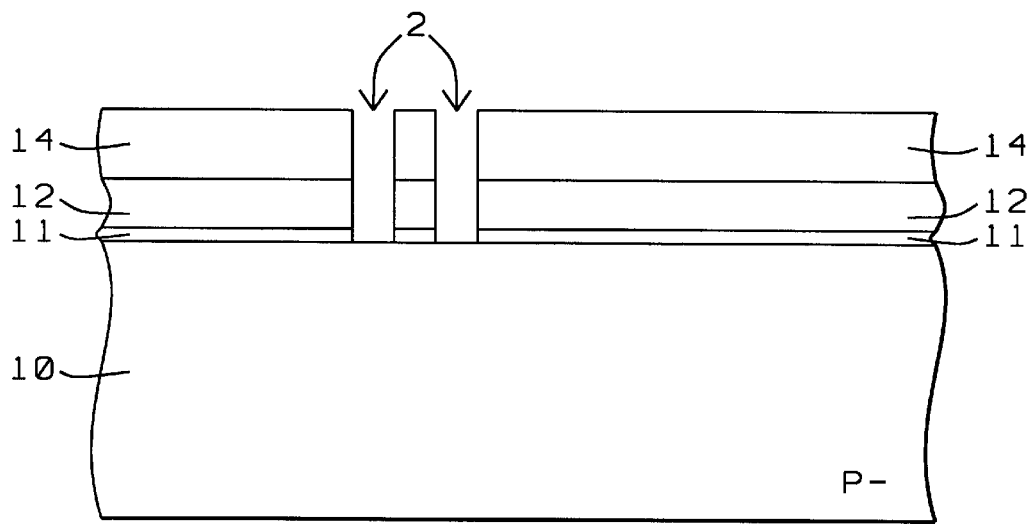
FIGS. 3 through 12 show schematic cross-sectional views for forming two adjacent deep trenches depicting the sequence of process steps by the method of this invention.

Referring to FIG. 3, the method for making these deep trench capacitors begins by providing a semiconductor substrate 10. The substrate is preferably a P-doped single-crystal silicon having a <100> crystal-lographic orientation. The substrate is thermally oxidized to form a thin $SiO_2$ stress-release layer 11, having a thickness of between about 30 and 50 Angstroms. Next a pad silicon nitride layer 12 is deposited using chemical vapor deposition (CVD) and a reactant gas mixture such as dichlorosilane ($SiCl_2H_2$) and ammonia ($NH_3$). The pad $Si_3N_4$ layer 12 is deposited to a thickness sufficient to reduce overetching (faceting of the deep trench openings) at the edge of the wafer. For example, the preferred thickness of the pad $Si_3N_4$ layer 12 is between about 1800 and 2200 Angstroms. Next, a first insulating layer 14 is deposited to complete a hard mask for etching the deep trenches (DT). Layer 14 is preferably a borosilicate glass (BSG) and is formed by CVD using tetraethosiloxane (TEOS) as the reactant gas and boron as the dopant gas, and is deposited to a thickness of between about 5000 and 7000 Angstroms.

Still referring to FIG. 3, conventional photolithographic techniques and anisotropic plasma etching are used to etch an array of openings 2 in the hard-mask layer (12 and 14) to the substrate. Typically an anti-reflecting coating (ARC) is coated on the substrate prior to applying the photoresist to minimize reflections and to improve photoresist image fidelity. The ARC and the photoresist are not shown in the Fig. The anisotropic plasma etching is carried out in a high-density plasma (HDP) etcher or a reactive ion etcher (RIE) to form the array of openings 2 for etching the deep trenches. Only two adjacent openings of the array of openings are depicted in the figures.

Figure 4:
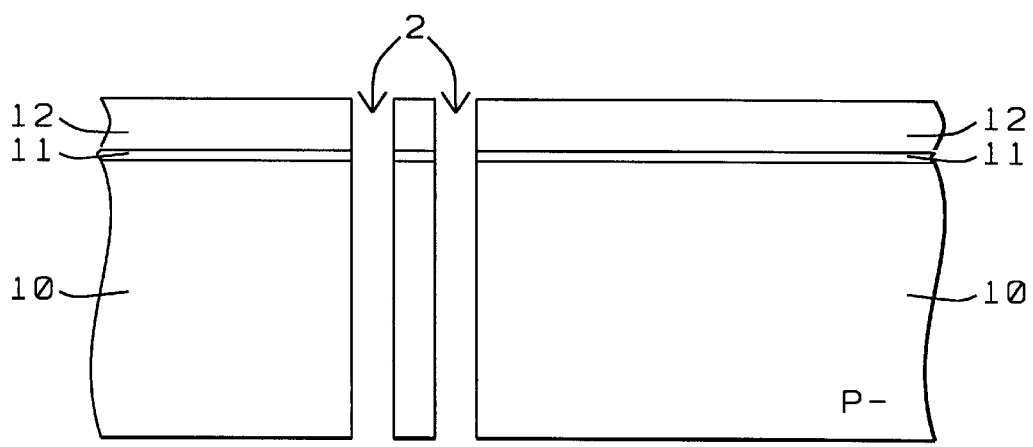

Referring to FIG. 4, after removing the photoresist mask, the hard-mask (12 and 14) is used as an etch mask and anisotropic plasma etching is used to etch deep trenches 2 in the substrate for capacitors. The etching is carried out in a HDP etcher and preferably using a chlorine-based etchant gas such as $Cl_2$, HCl, or a Br. Typically for current DRAM product the deep trenches 2 are etched to a depth of between about 7 and 8 micrometers (um) and have opening widths of about 0.18 to 0.28 um. Because of the depth of the trenches, the very bottoms of the trenches are not shown to simplify the drawings.

Figure 5:
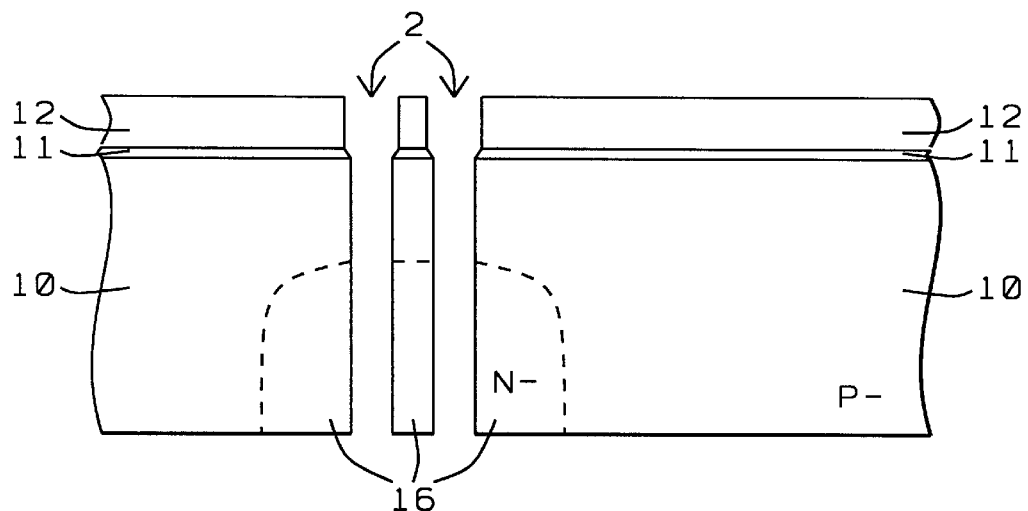

Referring to FIG. 5, an arsenic-doped glass (ASG) is deposited to fill the deep trenches 2. The ASG is deposited preferably by CVD. The ASG is then etched back to leave portions of the ASG in the lower portions of the trenches 2. The ASG is etched back using wet etching and a buffered hydrofluoric (BHF) etch solution. A diffusion cap oxide layer (not shown) is deposited to prevent out-diffusion of As from the top of the ASG diffusion source in the trenches. Typically the diffusion cap oxide layer is a CVD $SiO_2$ and is deposited using TEOS as the reactant gas.

Still referring to FIG. 5, the substrate 10 is then annealed to diffuse arsenic from the ASG into the substrate to form N-doped first capacitor electrodes 16 in the substrate adjacent to the lower portion of the trenches 2. The preferred dopant concentration of the capacitor electrodes 16 is between about 5.0 E 19 and 1.0 E 20 atoms/$cm^3$. The ASG is then removed by stripping using a BHF solution. Only the upper portions of the capacitor electrodes are depicted in FIG. 5. In FIG. 5, the first capacitor electrodes 16 are depicted after the ASG and cap oxide layers are removed.

Figure 6:
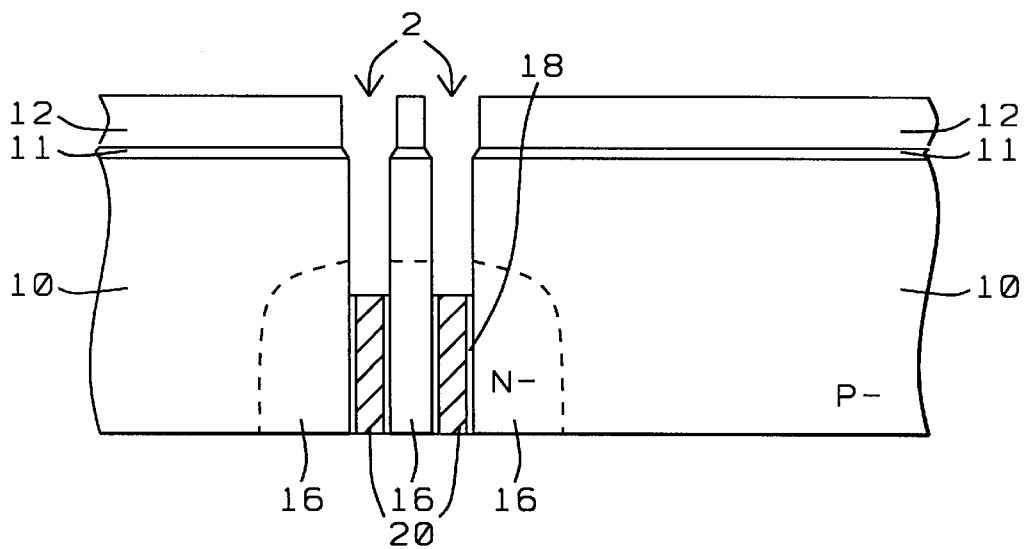

Referring to FIG. 6, a capacitor interelectrode dielectric layer 18 is formed on the sidewalls of the trenches 2 by depositing a thin $Si_3N_4$ layer. The $Si_3N_4$ is typically deposited by LPCVD using $SiCl_2H_2$ and $NH_3$ as the reactant gases, and is deposited to a preferred thickness of between about 40 and 50 Angstroms. An oxide is formed on the $Si_3N_4$ layer by reoxidization to form a silicon oxide/silicon nitride (ON) layer to complete the capacitor interelectrode dielectric layer 18 on the sidewalls of the trenches 2. The thermal oxidation also minimizes the pin holes in the $Si_3N_4$ layer.

Continuing with FIG. 6, an N doped first polysilicon layer 20 is deposited sufficiently thick to fill the trenches 2. Layer 20 is deposited by LPCVD using $SiH_4$ as the reactant gas, and is in-situ doped using an N type dopant such as phosphorus to a preferred concentration of between about 8.0 E 19 and 3.0 E 20 atoms/$cm^3$. The polysilicon layer 20 is then etched back to recess the polysilicon and to fill the lower portion of the trenches 2. The interelectrode dielectric layer 18 exposed in the upper portions of the trenches is selectively removed, as shown in FIG. 6. The ON is removed using a wet etch in a solution of BHF or HF.

Figure 7:
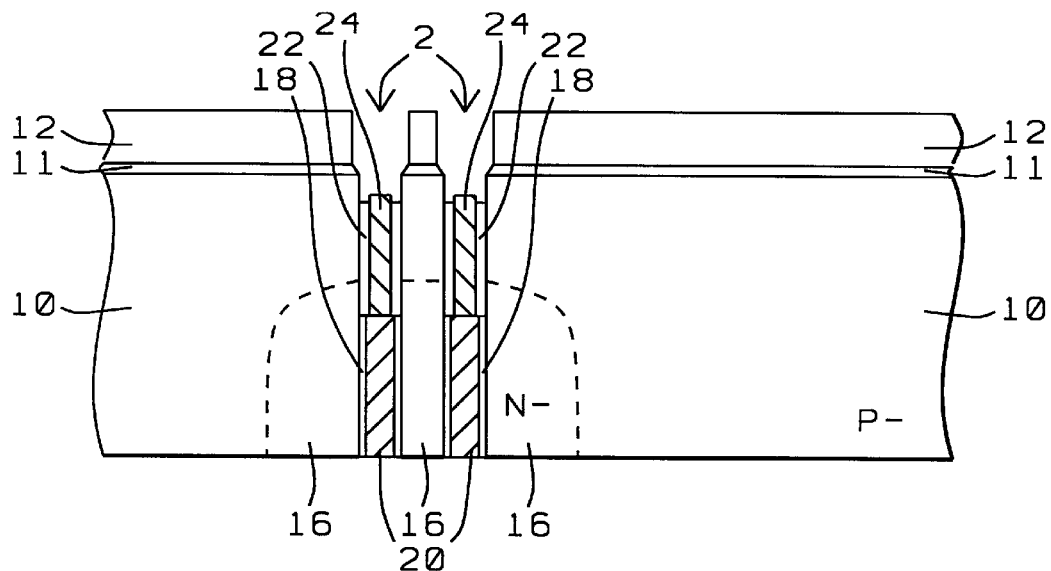

Referring to FIG. 7, a conformal collar $SiO_2$ layer 22 is deposited on the substrate 10 and on the sidewalls in the upper portions of the trenches. The $SiO_2$ is preferably deposited by CVD using, for example, TEOS as the reactant gas, and is deposited to a thickness of between about 500 and 700 Angstroms. After annealing, the collar $SiO_2$ layer 22 is anisotropically etched back to form a collar on the upper portions of the sidewalls in the trenches 2. The etching concurrently removes the collar oxide on the first polysilicon 20 in the bottom portions of the trenches.

Still referring to FIG. 7, an N doped second polysilicon layer 24 is deposited sufficiently thick to fill the trenches 2. Layer 24 is deposited by LPCVD using $SiH_4$ as the reactant gas, and is in-situ doped using an N type dopant such as phosphorus to a preferred concentration of between about 1.0 E 19 and 1.0 E 20 atoms/$cm^3$. The polysilicon layer 24 is then etched back to recess the polysilicon in the upper portions of the trenches and below the top surface of the substrate 10. The upper portions of the collar oxide 22 are then stripped, for example by dip etching in hydrofluoric (HF) acid, to expose the silicon substrate 10 in the upper edge of the trenches 2, as shown in FIG. 7.

Figure 8:
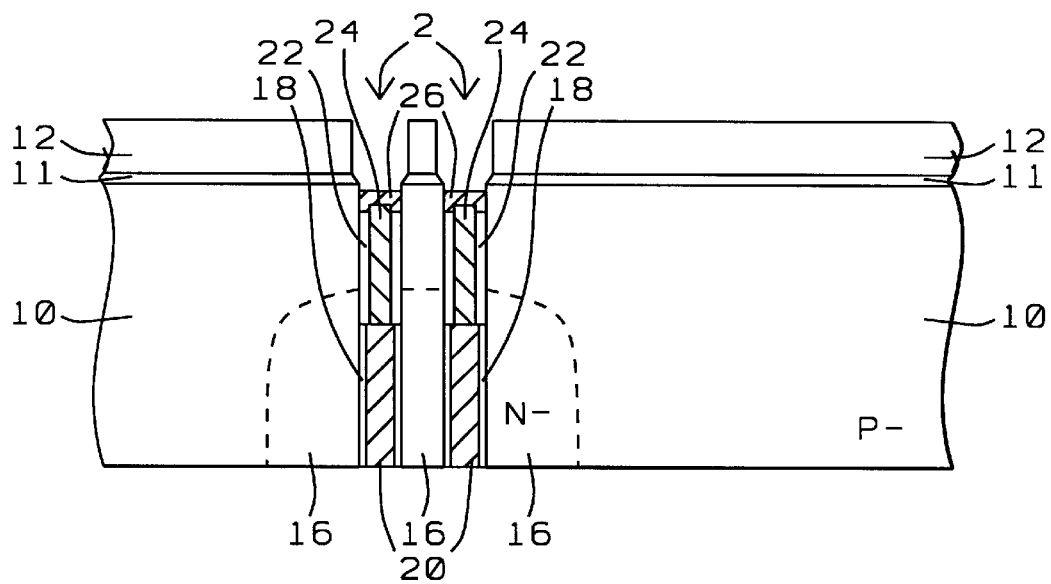

Referring to FIG. 8, a third polysilicon layer 26 is deposited sufficiently thick to fill the trenches 2. Layer 26 is then chemically-mechanically polished back to the pad $Si_3N_4$ layer 12, and the remaining polysilicon 26 in the trenches 2 is recessed to form interconnecting polysilicon straps 26 to connect the trench capacitors (portion 24) to the substrate 10 where semiconductor devices are typically formed. The polysilicon 26 is doped N+ to provide good electrical connections.

Figure 9:
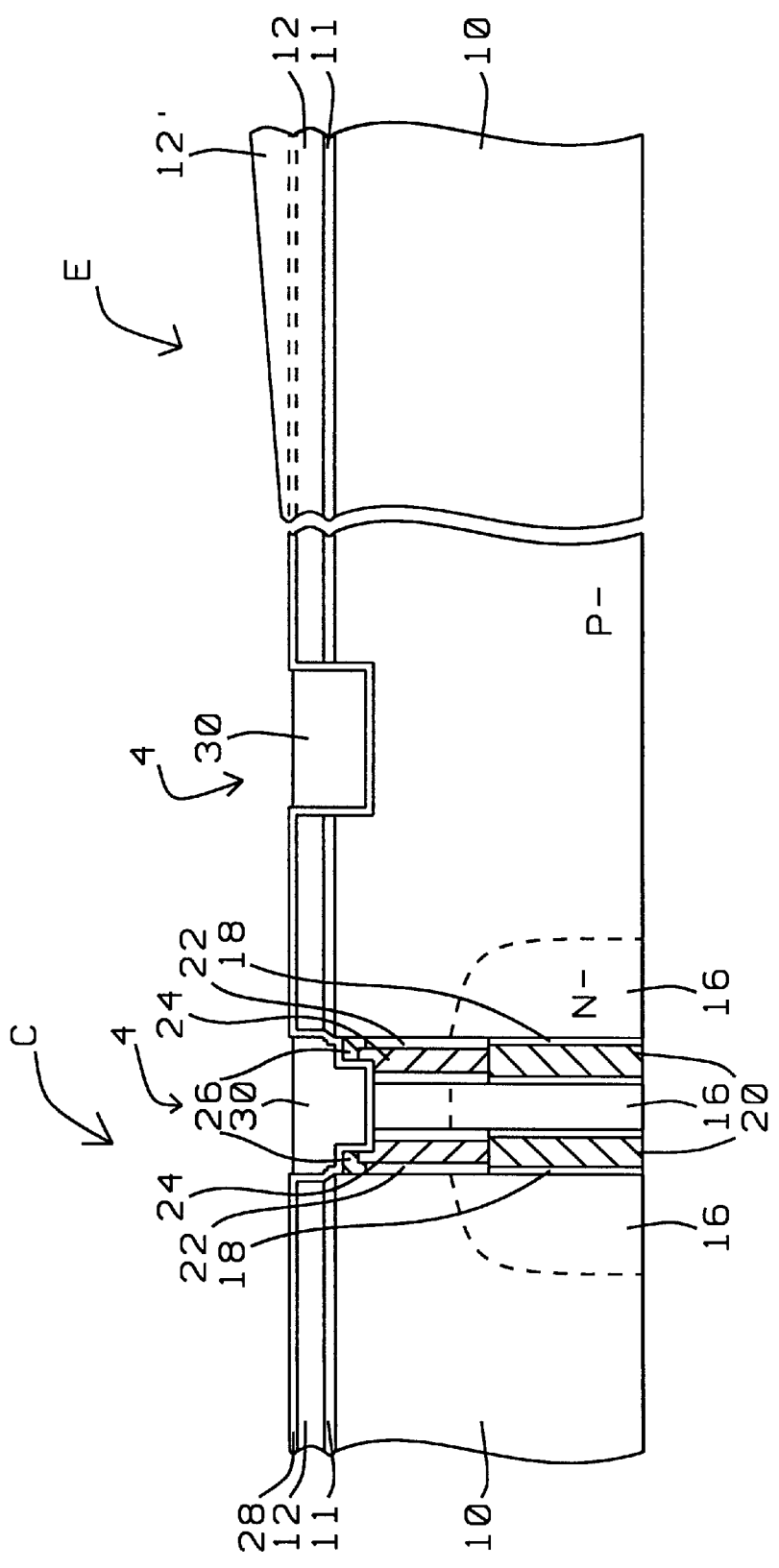

Referring to FIG. 9, the shallow trench isolation is formed next. Shallow trench openings 4 are etched in the substrate to separate the active device areas for electrical circuits. Concurrently the shallow trenches 4 are also etched over and between pairs of trench capacitors in the deep trenches 2 to electrically separate adjacent capacitors. Preferably the shallow trenches 4 are etched to a depth of about 2500 to 3000 Angstroms below the substrate surface 10. The exposed surfaces of the polysilicon (26, 24, and 20) and the substrate 10 are subjected to a rapid thermal oxidation to form a thin $SiO_2$ (not shown) to reduce surface damage (leakage). A relatively thin conformal insulating liner 28 is deposited. Layer 28 is preferably $Si_3N_4$ and is deposited to a thickness of between about 100 and 200 Angstroms.

Still referring to FIG. 9, a second insulating layer 30 is deposited sufficiently thick to fill the shallow trench openings 4. Layer 30 is preferably $SiO_2$ and is deposited by high-density-plasma CVD to a thickness at least equal to the total depth of the trenches 4 in pad $Si_3N_4$ layer 12 and the substrate 10. Layer 30 is then chem-mech polished (CMP) back to the pad layer 12 which also serves as a polishing stop layer to form the STI 30 in the openings 4. Unfortunately the CMP rate across the wafer is inherently nonuniform, resulting in the pad layer 12 having an increased thickness 12' at the edge of the wafer, labeled E for the edge and C for the center of the wafer in FIG. 9.

Figure 10:
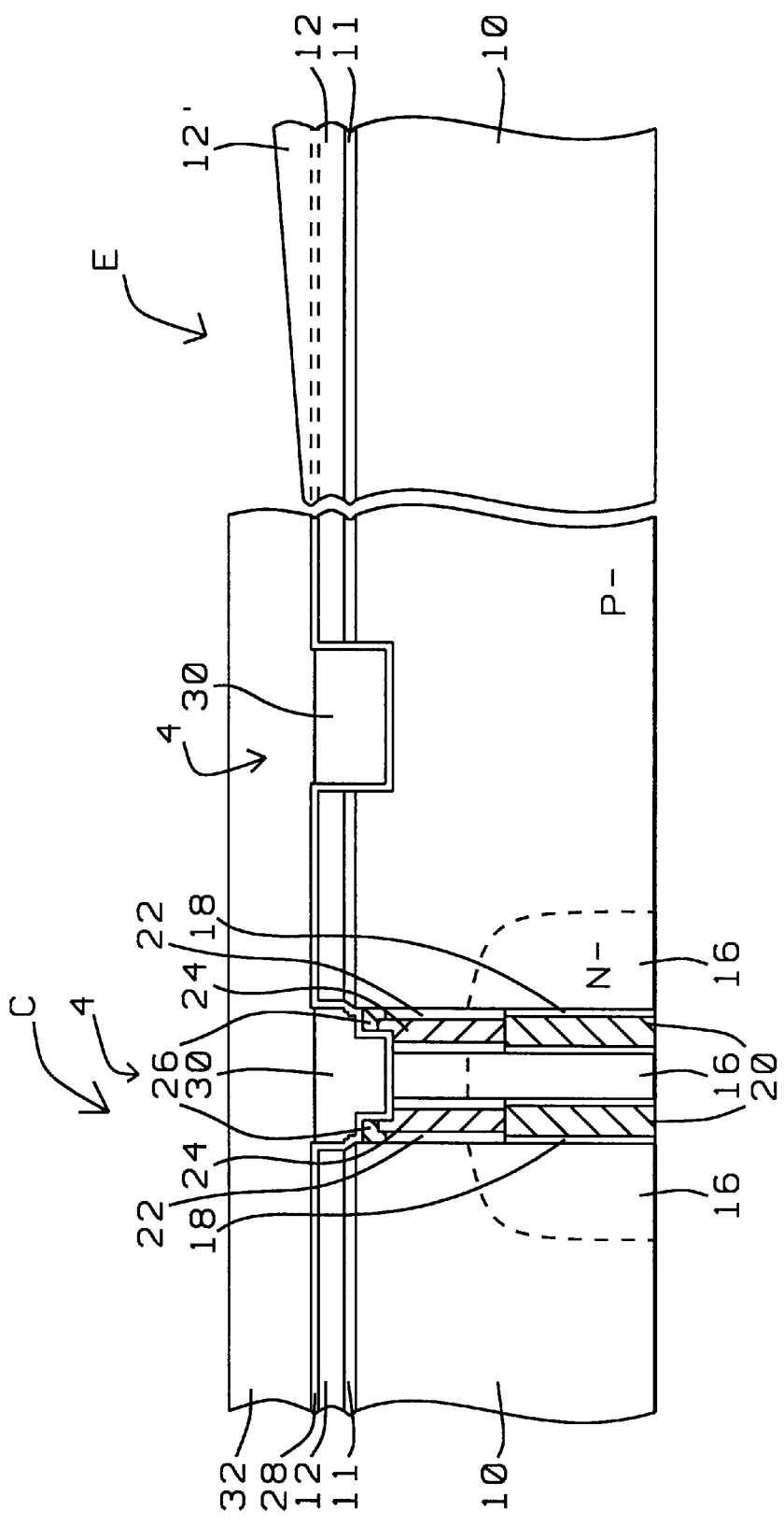
Figure 13:
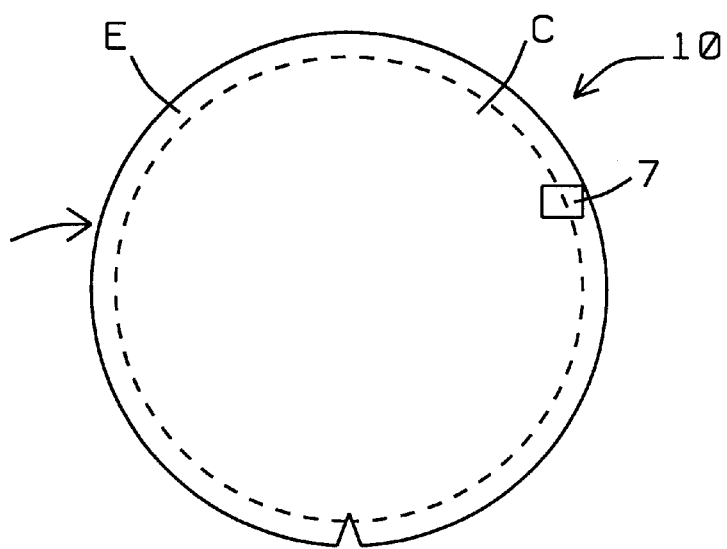
FIG. 13 shows a schematic top view of a semiconductor wafer (substrate) having the novel mask design for reducing the thickness of the pad silicon nitride layer at the edge of the wafer due to the nonuniform loading effect during chemical-mechanical polishing.
Figure 14:
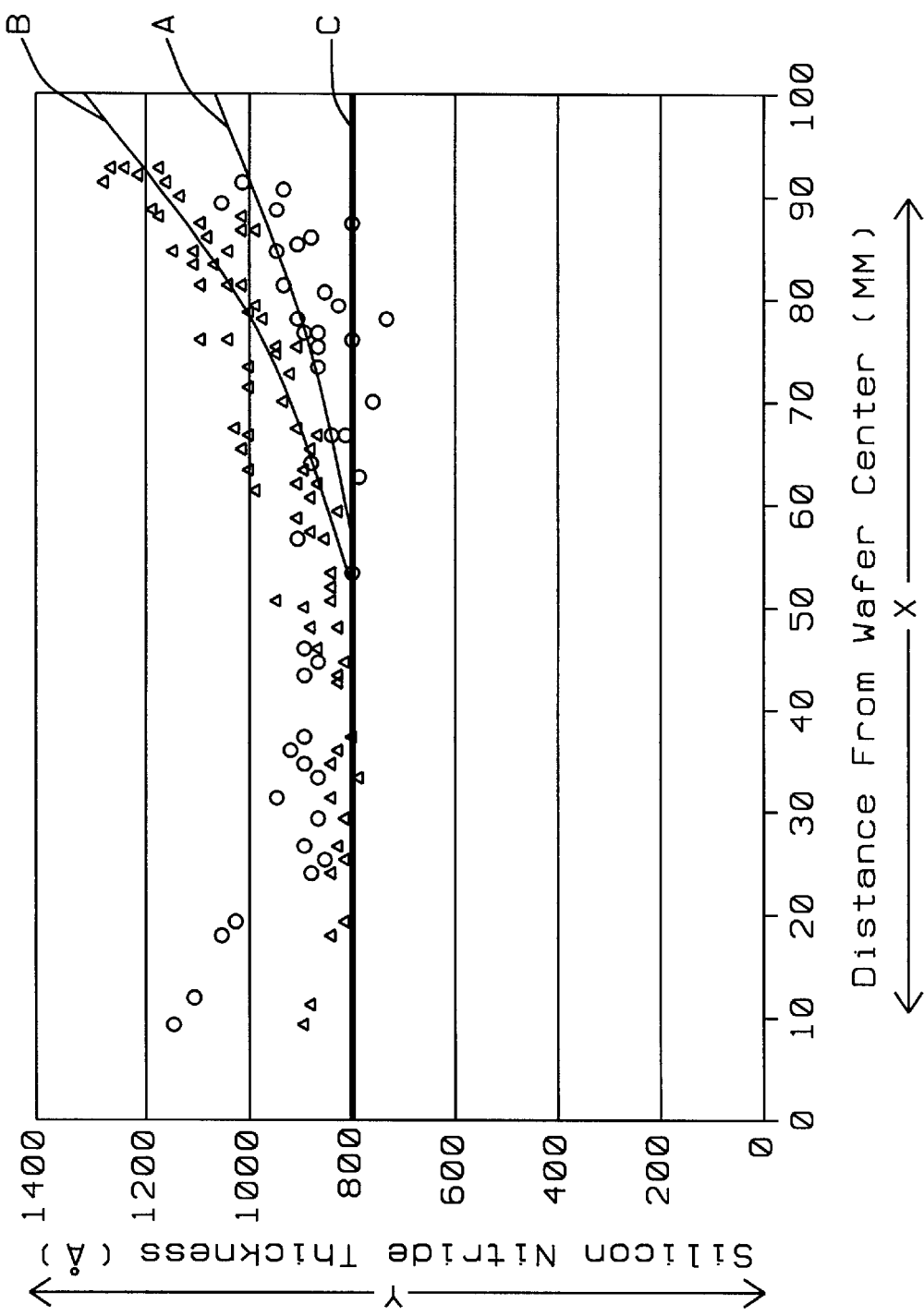
FIG. 14 shows a graph of the silicon nitride thickness profile after shallow trench isolation chemical-mechanical polishing using two different polishing methods, and depicts the significant increase in $Si_3N_4$ thickness as a function of distance to the edge of the wafer due to the loading effect.

Referring to FIG. 10, a key feature of this invention is to deposit a second mask layer 32. The second mask 32 is preferably composed of organic photoresist and is spin coated to a thickness of between about 2000 and 5000 Angstroms depending on the etching budget requirements. The photoresist is then exposed and developed. The mask is patterned to leave blanket portions of the mask 32 over the center portions C of the wafer, while exposing the underlying $Si_3N_4$ pad layer 12 which includes the portion of 12' having increased thickness on the edge E of the wafer. To better appreciate the method, a top view of the wafer 10 is shown in FIG. 13. The center of the wafer having the mask is depicted by the center area C and the edge of the wafer is depicted by edge area E. Also shown is a chip area 7 representing an electrical device or integrated circuit near the edge of the wafer.

Figure 11:
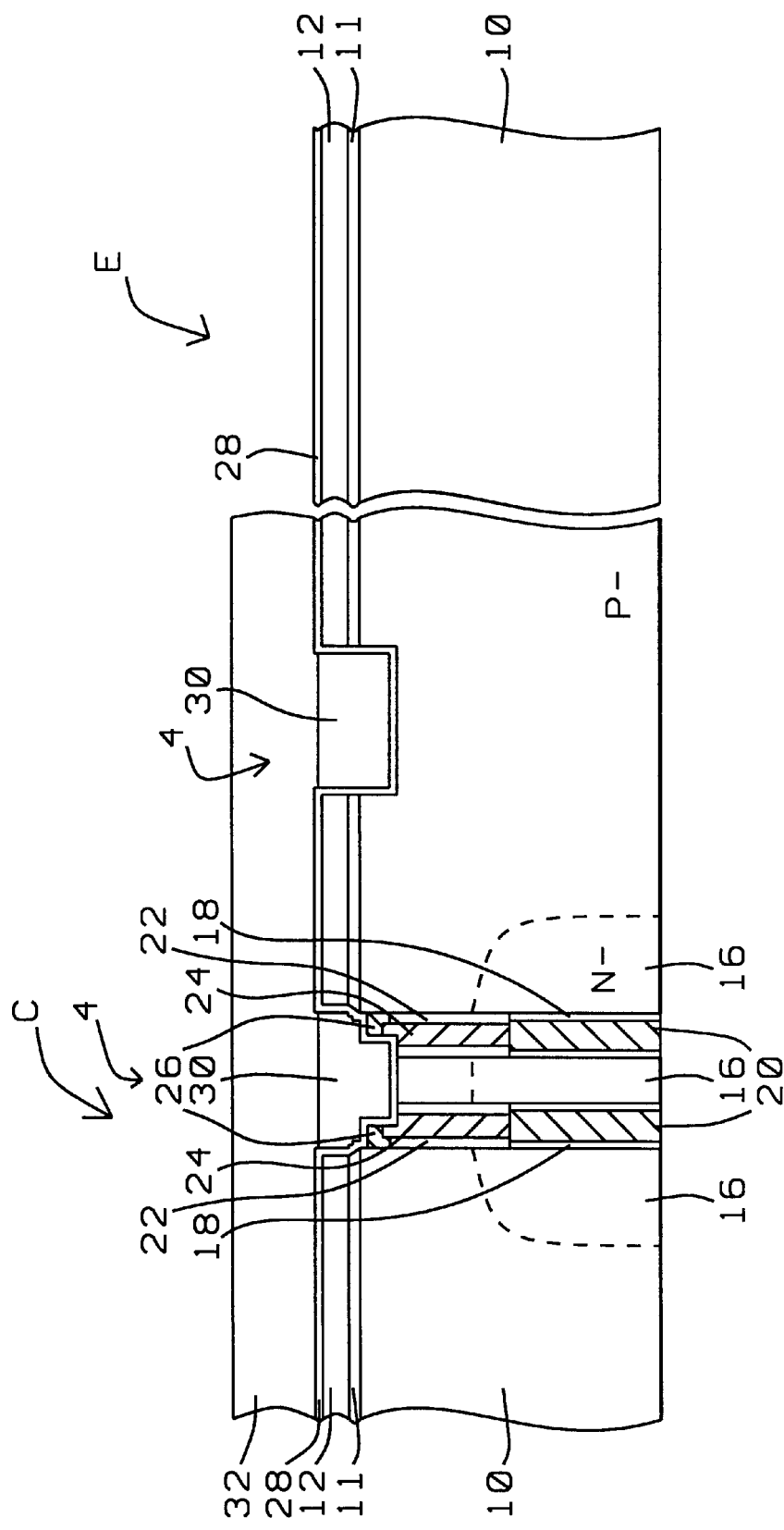

Referring now to FIG. 11, the mask 32 is used to protect the center of the wafer C while the thicker portion 12' of pad layer 12 is removed by selective etching. The $Si_3N_4$ portion 12' is removed using a timed wet etch or a plasma etch. The preferred wet etch is carried out using a hot phosphoric acid ($H_3PO_4$). After removing the thicker portion 12' of the pad layer 12 to form a more uniform thickness across the wafer, the mask layer 32 is removed by plasma ashing.

Figure 12:
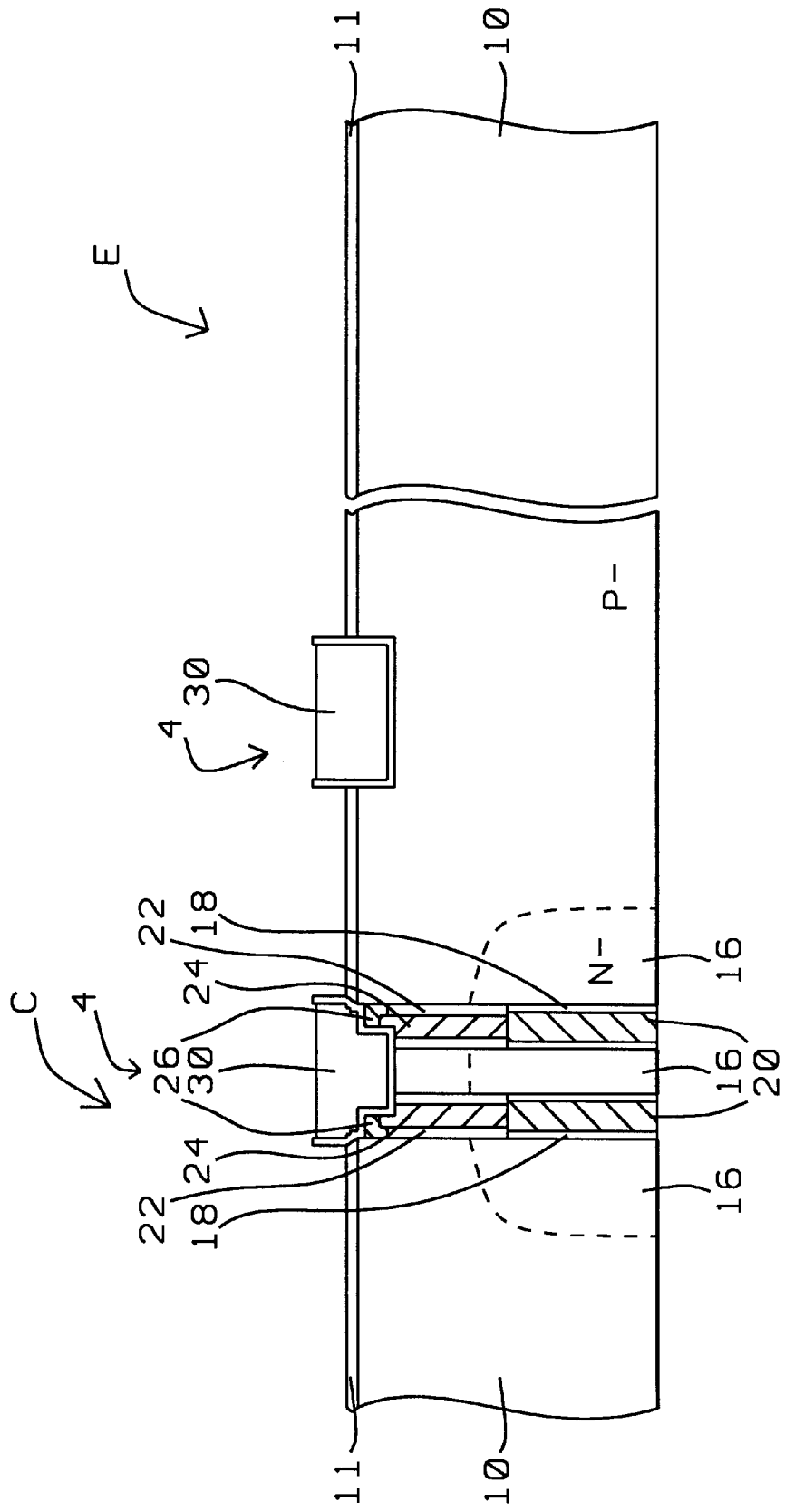

Finally as shown in FIG. 12, the $Si_3N_4$ pad layer 12 is selectively removed to the pad oxide layer 11 using a hot phosphoric acid etch.

While the invention has been particularly shown and described with reference to the preferred embodiment thereof, it will be understood by those skilled in the art that various changes in form and details may be made without departing from the spirit and scope of the invention.

What is claimed is:

1. A method for manufacturing an array of deep trench capacitors for DRAM devices having reduced overetch of deep trenches at a substrate edge and a more uniform pad silicon nitride layer across a substrate comprising the steps of:

providing a silicon substrate;

forming a hard-mask layer consisting of a pad silicon nitride layer and a first insulating layer, wherein said pad silicon nitride layer is deposited to a thickness sufficient to prevent overetching at edge of said substrate;

forming an array of openings in said hard-mask layer to said substrate, and using said hard-mask to etch deep trenches in said substrate;

forming trench capacitors in said deep trenches;

etching shallow trench openings in said substrate over and between pairs of said trench capacitors in said deep trenches;

depositing a conformal insulating liner, and depositing a second insulating layer sufficiently thick to fill said shallow trench openings;

polishing back said second insulating layer to form shallow trench isolation in said shallow trench openings;

depositing a mask layer;

patterning said mask layer to leave blanket portions over center of said substrate while exposing said pad silicon nitride layer on edge of said substrate;

partially etching said pad silicon nitride layer on said substrate edge to improve uniformity of said pad silicon nitride layer across said substrate.

2. The method of claim 1, wherein said pad silicon nitride layer is deposited to a thickness of between 1800 and 2200 Angstroms.

3. The method of claim 1, wherein said first insulating layer is a borosilicate glass and is deposited to a thickness 5000 and 7000 Angstroms.

4. The method of claim 1, wherein said deep trenches are etched to a depth of between 7 and 8 micrometers.

5. The method of claim 1, wherein said trench capacitors are formed by:

forming an arsenic-doped glass in lower portion of said deep trenches and annealing to diffuse arsenic into said substrate to form first capacitor electrodes, and removing said arsenic-doped glass;

forming a capacitor interelectrode dielectric layer by depositing a silicon nitride layer and reoxidizing to form said capacitor interelectrode dielectric layer on sidewalls of said deep trenches;

forming an N doped first polysilicon to fill said lower portion of said deep trenches, and removing exposed portions of said capacitor interelectrode dielectric layer in upper portion of said deep trenches;

depositing a collar silicon oxide layer and etching back to form a collar on upper portion of said sidewalls of said deep trenches;

forming an N doped second polysilicon in said upper portion of said deep trenches to form said trench capacitors;

depositing an N doped third polysilicon layer and etching back to form interconnecting polysilicon straps to connect said trench capacitors to said substrate.

6. The method of claim 1, wherein said shallow trench openings are etched in said silicon substrate to a depth of between about 2500 and 3000 Angstroms.

7. The method of claim 1, wherein said conformal insulating liner is silicon nitride and is deposited to a thickness of between about 100 and 200 Angstroms.

8. The method of claim 1, wherein said second insulating layer is silicon oxide deposited by high-density plasma chemical vapor deposition (HUDP-CVD) using a reactant gas of tetraethosiloxane (TEOS), and to a thickness greater than a depth of said shallow trench isolation.

9. The method of claim 1, wherein said mask layer is organic photoresist and is spin coated to a thickness of between about 2000 and 5000 Angstroms.

10. A method for manufacturing an array of deep trench capacitors for DRAM devices having reduced overetch of deep trenches at a substrate edge and a more uniform pad silicon nitride layer across a substrate comprising the steps of:

providing a silicon substrate;

forming a hard-mask layer consisting of a pad silicon nitride layer and a first insulating layer, wherein said pad silicon nitride layer is deposited to a thickness sufficient to prevent overetching at edge of said substrate;

forming an array of openings in said hard-mask layer to said substrate, and using said hard-mask to etch deep trenches in said substrate;

forming trench capacitors in said deep trenches by:

forming an arsenic-doped glass in lower portion of said deep trenches and annealing to diffuse arsenic into said substrate to form first capacitor electrodes, and removing said arsenic-doped glass;

forming a capacitor interelectrode dielectric layer by depositing a silicon nitride layer and reoxidizing to form said capacitor interelectrode dielectric layer on sidewalls of said deep trenches;

forming an N doped first polysilicon to fill said lower portion of said deep trenches, and removing exposed portions of said capacitor interelectrode dielectric layer in upper portion of said deep trenches;

depositing a collar silicon oxide layer and etching back to form a collar on upper portion of said sidewalls of said deep trenches;

forming an N doped second polysilicon in said upper portion of said deep trenches to form said trench capacitors;

depositing an N doped third polysilicon layer and etching back to form interconnecting polysilicon straps to connect said trench capacitors to said substrate;

etching shallow trench openings in said substrate over and between pairs of said trench capacitors in said deep trenches;

depositing a conformal insulating liner, and depositing a second insulating layer sufficiently thick to fill said shallow trench openings;

polishing back said second insulating layer to form shallow trench isolation in said shallow trench openings;

depositing a mask layer;

patterning said mask layer to leave blanket portions over center of said substrate while exposing said pad silicon nitride layer on edge of said substrate;

partially etching said pad silicon nitride layer on said substrate edge to improve uniformity of said pad silicon nitride layer across said substrate;

selectively removing said pad silicon nitride layer to complete said array of deep trench capacitors for DRAM devices.

11. The method of claim 10, wherein said pad silicon nitride layer is deposited to a thickness of between 1800 and 2200 Angstroms.

12. The method of claim 10, wherein said first insulating layer is a borosilicate glass and is deposited to a thickness 5000 and 7000 Angstroms.

13. The method of claim 10, wherein said deep trenches are etched to a depth of between 7 and 8 micrometers.

14. The method of claim 10, wherein said shallow trench openings are etched in said silicon substrate to a depth of between about 2500 and 3000 Angstroms.

15. The method of claim 10, wherein said conformal insulating liner is silicon nitride and is deposited to a thickness of between about 100 and 200 Angstroms.

16. The method of claim 10, wherein said second insulating layer is silicon oxide deposited by high-density plasma chemical vapor deposition (HDP-CVD) using a reactant gas of tetraethosiloxane (TEOS), and to a thickness greater than a depth of said shallow trench isolation.

17. The method of claim 10, wherein said mask layer is removed from said substrate using a plasma asher.

\* \* \* \* \*